(12) United States Patent
Kus et al.

(10) Patent No.: US 12,230,851 B2
(45) Date of Patent: Feb. 18, 2025

(54) METHOD OF MANUFACTURING OF A MEMBRANE WITH SURFACE FIBRE STRUCTURE, MEMBRANE MANUFACTURED BY THIS METHOD AND USE OF SUCH MEMBRANE

(71) Applicant: Univerzita Karlova, Prague (CZ)

(72) Inventors: Peter Kus, Bratislava (SK); Yurii Yakovlev, Mykolaiv (UA); Vladimir Matolin, Zdiby (CZ)

(73) Assignee: Univerzita Karlova, Prague (CZ)

( * ) Notice: Subject to any disclaimer, the term of this patent is extended or adjusted under 35 U.S.C. 154(b) by 523 days.

(21) Appl. No.: 17/278,892

(22) PCT Filed: Sep. 27, 2019

(86) PCT No.: PCT/CZ2019/050041
§ 371 (c)(1),
(2) Date: Mar. 23, 2021

(87) PCT Pub. No.: WO2020/064034
PCT Pub. Date: Apr. 2, 2020

(65) Prior Publication Data
US 2022/0045347 A1    Feb. 10, 2022

(30) Foreign Application Priority Data
Sep. 30, 2018 (CS) .................. CZ2018-514

(51) Int. Cl.
*H01M 8/1086* (2016.01)
*C23C 14/35* (2006.01)
(Continued)

(52) U.S. Cl.
CPC .......... *H01M 8/1086* (2013.01); *C23C 14/35* (2013.01); *C25B 13/02* (2013.01); *C25B 13/04* (2013.01);
(Continued)

(58) Field of Classification Search
CPC ............ H01M 8/1086; H01M 8/1004; H01M 2008/1095; H01M 2300/0082;
(Continued)

(56) References Cited

U.S. PATENT DOCUMENTS 4,620,898 A * 11/1986 Banks ................. H01J 37/3056
156/345.39
6,017,430 A * 1/2000 Hodgson ............... C25B 11/091
427/78

(Continued)

FOREIGN PATENT DOCUMENTS

WO   WO-2020064034 A1   4/2020

OTHER PUBLICATIONS

Dubau et al. (ACS Appl. Mater. Interfaces 2014, 6, 1213-1218) (Year: 2014).*
(Continued)

*Primary Examiner* — Milton I Cano
*Assistant Examiner* — Joshua P McClure
(74) *Attorney, Agent, or Firm* — Schwegman Lundberg & Woessner, P.A.

(57) ABSTRACT

Method of manufacturing of a membrane with surface fiber structure, in particular for use in an electrolyzer or fuel cell, by inserting the polymer membrane into the vacuum chamber equipped with a magnetron sputtering system with a cerium oxide target in which an atmosphere of $O_2$ and inert gas is formed and igniting the plasma which leads to simultaneous plasma etching of the membrane surface and deposition of cerium oxide onto the surface of etched membrane resulting in formation of fibers. The membrane is made of polymer and on at least one of its sides features porous surface made of fibers, the cross-sectional dimensions of which are lower than their length and which are integral and inseparable part of membrane body.

9 Claims, 4 Drawing Sheets

(51) Int. Cl.
*C25B 13/02* (2006.01)
*C25B 13/04* (2021.01)
*H01M 8/1004* (2016.01)
*H01M 8/10* (2016.01)

(52) U.S. Cl.
CPC .. *H01M 8/1004* (2013.01); *H01M 2008/1095* (2013.01); *H01M 2300/0082* (2013.01)

(58) Field of Classification Search
CPC ....... H01M 4/8871; H01M 8/00; C23C 14/35; C25B 13/02; C25B 13/04
See application file for complete search history.

(56) References Cited

U.S. PATENT DOCUMENTS

| | | | |
|---|---|---|---|
| 2007/0077350 | A1 | 4/2007 | Hohenthanner et al. |
| 2008/0200002 | A1* | 8/2008 | Suzuki .............. H01L 21/76877 257/E21.585 |
| 2010/0102026 | A1* | 4/2010 | Lee ..................... C23C 16/0263 427/535 |
| 2011/0257004 | A1* | 10/2011 | Matolin ................... B01J 23/66 502/5 |

OTHER PUBLICATIONS

"International Application No. PCT/CZ2019/050041, International Search Report and Written Opinion mailed Nov. 25, 2019", (Nov. 25, 2019), 10 pgs.

Fiala, R., et al., "Proton exchange membrane fuel cell made of magnetron sputtered Pt-CeOx and Pt-Co thin film catalysts", Journal of Power Sources, vol. 273, Jan. 1, 2015, pp. 105-109 [abstract only], (Sep. 16, 2014), 105-109.

Fiala, Roman, et al., "High efficiency of Pt2+—Ce02 novel thin film catalyst as anode for proton exchange membrane fuel cells", Applied Catalysis B: Environmental, vol. 197, Nov. 15, 2016, pp. 262-270 [abstract only], (Nov. 15, 2016), 262-270.

\* cited by examiner

METHOD OF MANUFACTURING OF A MEMBRANE WITH SURFACE FIBRE STRUCTURE, MEMBRANE MANUFACTURED BY THIS METHOD AND USE OF SUCH MEMBRANE

PRIORITY CLAIM TO RELATED APPLICATIONS

This application is a U.S. national stage filing under 35 U.S.C. § 371 from International Application No. PCT/CZ2019/050041, filed on 27 Sep. 2019, and published as WO2020/064034 on 2 Apr. 2020, which claims the benefit under 35 U.S.C. 119 to Czechia Application No. PV 2018-514, filed on 30 Sep. 2018, the benefit of priority of each of which is claimed herein, and which applications and publication are hereby incorporated herein by reference in their entirety.

TECHNICAL FIELD

The invention falls in the field of physics and electrochemistry, more specifically in the area of tools used for water electrolysis and hydrogen generation or for generation of electricity by means of hydrogen or methanol fuel cell.

BACKGROUND ART

According to the type of used electrolyte the modern water electrolyzers can be divided into several groups. The most commonly known are the alkaline electrolyzers. However, in the past couple of years the water electrolyzers with proton exchange membrane (PEM) are getting increasing attention.

Water electrolyzers with PEM are utilizing noble metals in role of reliable catalysts for individual redox reactions; more specifically platinum on the cathode and iridium (also in oxidized form) on the anode. Given that both Pt and Ir are precious and expensive, it is industrially desirable to use as little as possible of these metals while maintaining the electrolysis efficiency. To achieve this, the noble metal nanoparticles are finely dispersed within the mixture of ionomer and nanoparticles of catalyst support in order to maximize their overall specific surface.

Such mixture could be prepared by putting together the elements in their pure form or by numerous wet techniques, using precursors, by thermal decompositions etc. Subsequently, the mixture is, by various techniques, spread over the surface of PEM, creating catalyst coated membrane (CCM); alternatively, the mixture can be spread over the liquid/gas diffusion layer (LGDL) which is in contact with PEM. Owing to the high surface of catalyst supports it is nowadays possible to reduce the catalyst loading to the units of mg·cm$^{-2}$ (anode+cathode); however, even this amount is considered to be too high for mass production. Also, it should be emphasized that in case of the anode of water electrolyzer, the choice of reliable catalyst support is very problematic since the high operational potential renders common carbon-based nanoparticles (used for example on electrodes of hydrogen fuel cells) inapplicable.

Therefore, in practice, it is either being experimented with exotic materials, which still have questionable long-term stability, or the Ir-based catalyst is used completely unsupported in large amounts (hence only Pt loading on cathode is reduced).

One of the proposed alternative for achieving high surface for consequent catalyst deposition is based on growing of organised organic pigment whiskers. This method however combines so-called dry step and laminate transfer to PEM which complicates the overall process and results in nontrivial multicomponent CCM structure.

SUMMARY OF INVENTION

The subject of this invention is a method of manufacturing of a modified membrane, combining the simultaneous plasma etching and reactive magnetron sputtering which circumvents the fundamental shortcomings of the above-mentioned state of the art such as usage of large amount of catalyst when not being supported on other particles and usage of nontrivial multicomponent CCM structure.

The membrane which is manufactured by such method, combining the simultaneous reactive magnetron sputtering and plasma etching therefore achieves standard efficiency while utilizing significantly lower noble metal loading without the need of any particle-based catalyst support or complex layer on the anode and/or the cathode side of the membrane surface.

The method of manufacturing of a membrane is carried out in the following steps:
1. The pure membrane is put into a vacuum chamber equipped with magnetron deposition system;
2. After reaching the sufficient level of base pressure, the optimal composition of working atmosphere is mixed, consisting of $O_2$ and inert gas, usually Ar, in ratio between 1:4 up to 1:400;
3. Plasma is ignited by the radio frequency power generator over the surface of $CeO_2$ ceramic sputtering target;
4. As a result of simultaneous plasma etching of the PEM and deposition of $CeO_x$ thin film, the fiber-like structure with high specific area is being created over the surface of the membrane. The $CeO_x$ serves the role of a masking element, since the etching is hindered at the places with sufficient coverage of $CeO_x$ layer; the thickness of resultant $CeO_x$ layer is usually in range of tenths to tens of nm. In contrast, membrane surface with no or insufficient $CeO_x$ protection is continuously etched to a high degree. Combination of the above mentioned processes leads to characteristic fiber-like structure of the membrane surface;
5. If necessary, the same procedure is carried out on the other side of the membrane surface;
6. Subsequently, the modified surface of PEM is covered (using another magnetron deposition system) by thin film of catalyst; Ir or $IrO_2$ is the usual choice on the anode, while Pt is generally used on the cathode. However, principally any catalyst which is suitable for given redox reaction may be used, e.g. Pt—Ru, Pt—Ir, Pt—Ir(O)$_x$, Ir—Ru(O)$_x$.

The final result of the method described above is the membrane with a very thin layer of catalyst sputtered on the modified surface of the membrane.

The modified membrane is highly porous due to the formation of fibers on its surface which originate from the membrane itself not from any specific additional layer. The fibers emerge perpendicularly from the surface of the membrane and their cross-sectional dimensions are smaller than their height. The membrane prepared this way allows for much higher catalyst dispersion, due to its much larger surface in comparison to the pure membrane. As a result of better catalyst utilization, significantly lower catalyst loadings leads to standard performances and efficiencies.

The presence of sputtered thin-film catalyst on the modified membrane with large surface can be easily verified by the naked eye; e.g. 50 nm of Ir appears black and matte in contrast to silver and gloss layer deposited on flat surface.

The membrane prepared in the above mentioned way also has the advantage of its structural simplicity over the already known membranes with thin-film coating which rely on catalyst supports or multilayer complex design to achieve the large surface. The herein described modified membrane itself features sufficiently high surface for thorough dispersion of catalyst without the need of additional use of catalyst support or dedicated multilayer structure.

If a suitable multi-target deposition apparatus is used, the whole process can be carried out in a single vacuum entry (i.e. the vacuum chamber is pumped down only once) such that the clean pristine PEM is inserted and after the above described process, the complete etched thin-film catalyst-coated PEM with large surface on both sides is obtained.

Regardless if the described process is carried out in one vacuum entry or multiple entries, there is no need of mixing the catalyst with ionomer and catalyst support in any form and no subsequent transferring of this mixture onto the PEM is necessary. Thus, CCM is prepared exclusively by dry technique using a vacuum deposition method—the magnetron sputtering.

The modified membrane is so porous and has such a large surface area that, if necessary, it is possible, but not mandatory, to deposit an intermediate layer on the membrane surface (up to of hundreds of nm) before deposition of the catalyst itself; for example, to improve catalyst adhesion or stability.

DESCRIPTION OF EMBODIMENTS

EXAMPLES

Figure 1:
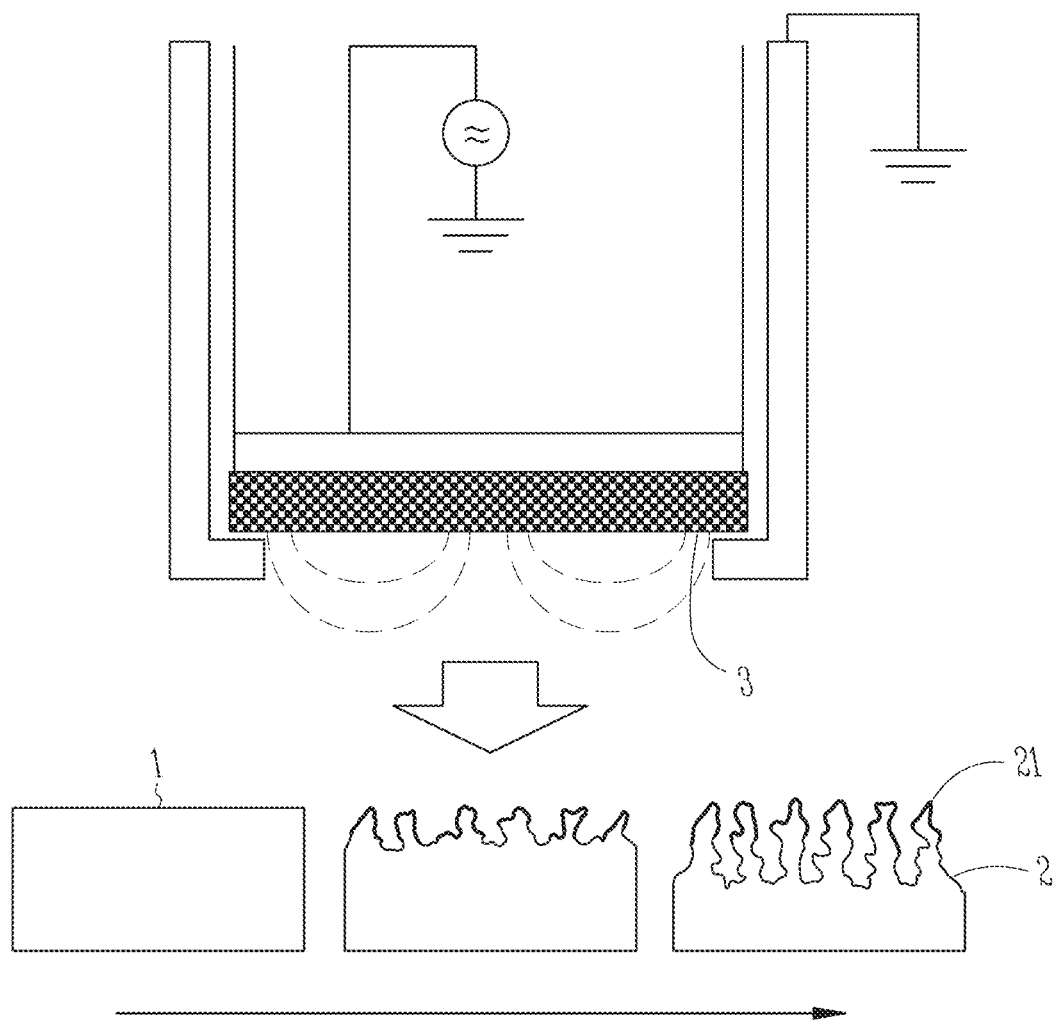
FIG. 1 depicts a method diagram for the simultaneous plasma etching of a PEM membrane and CeOx deposition by reactive magnetron sputtering from a ceramic CeO2 target in a mixed Ar+O2 working atmosphere and its effect on the membrane.
Figure 2:
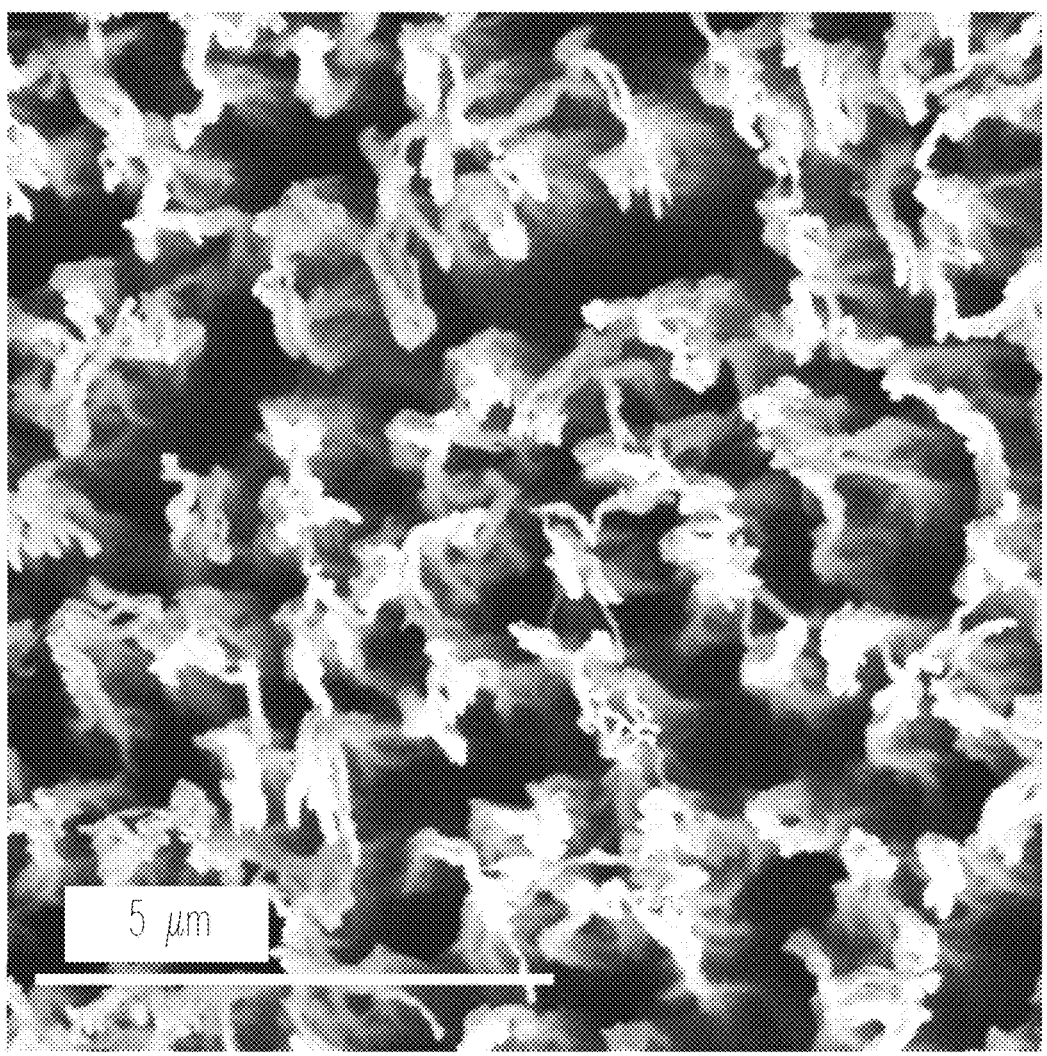
FIG. 2 shows a scanning electron microscope image of the modified membrane surface.
Figure 3:
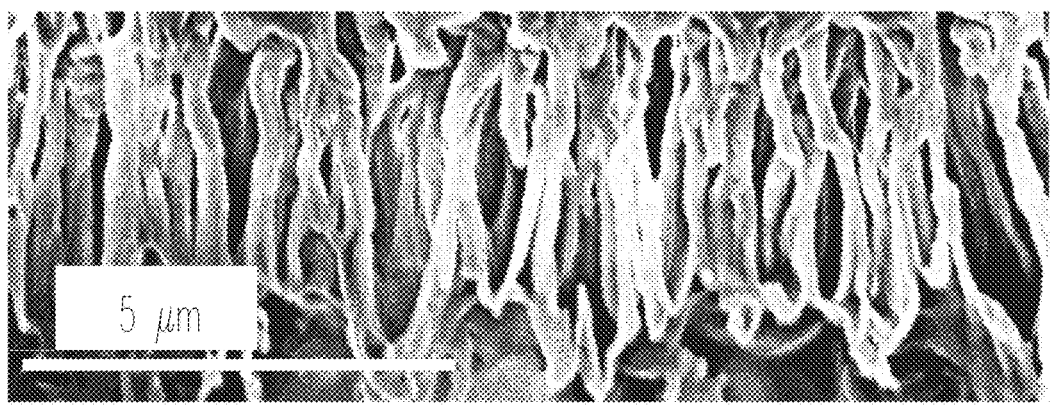
FIG. 3 shows a cross-sectional image of the modified membrane obtained by a scanning electron microscope.
Figure 4:
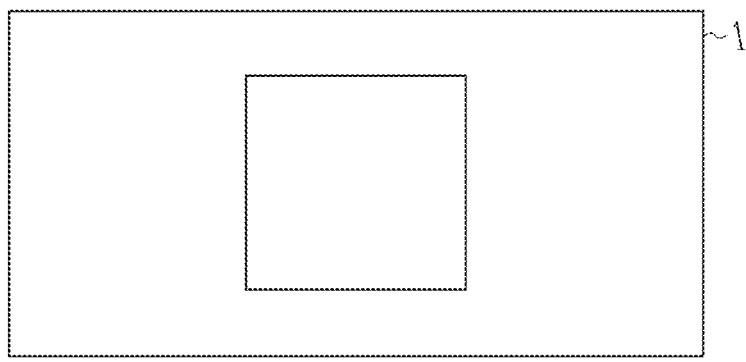
FIG. 4 exemplifies the modified surface of PEM without the catalyst layer which features the opaque milky colour, contrasting with the glossy transparent surface of the unmodified part of PEM. The modified part of PEM with 50 nm thin film of metal catalyst features the matt black colour, contrasting with the glossy transparent surface of the unmodified part of PEM.
Figure 4:
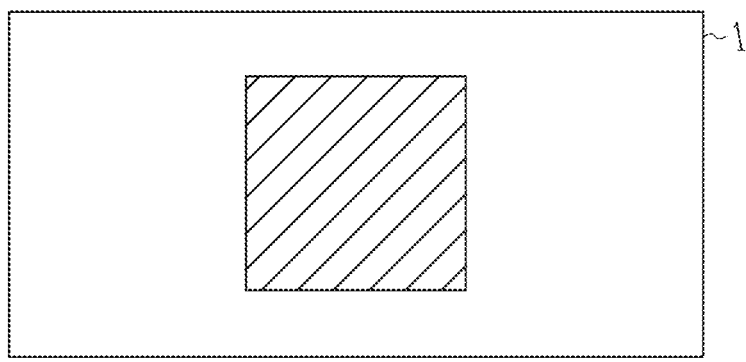
Figure 5:
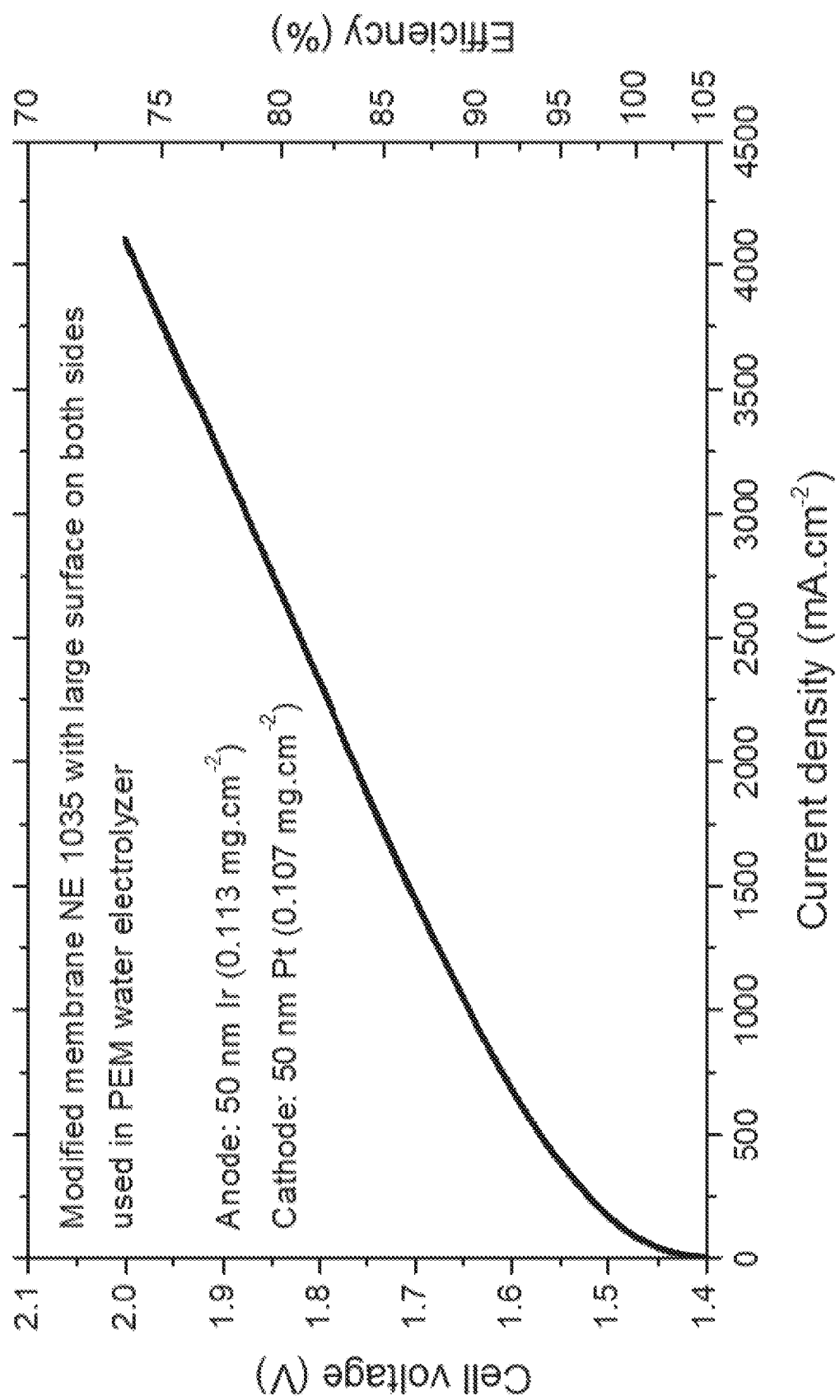
FIG. 5 depicts the IV curve of a PEM water electrolyser operating at 80° C. using a double-sided modified thin-film catalyst membrane according to Example 2.

Example 1 describes a convenient method of preparing the membrane 1 by which its specific properties are achieved. The manufacturing method of the membrane 1 proceeds in the following steps:
1. Pure membrane 1 (e.g. Nafion, Aquivion, 3M ionomer) with still a smooth flat surface is attached to a suitable holder and placed in a vacuum chamber equipped with a magnetron deposition system (one magnetron head or multiple magnetron system).
2. The chamber is evacuated to the base pressure equal or better than $1.10^{-4}$ Pa. A working atmosphere consisting of O2 and Ar in a ratio ranging from 1:400 to 1:40 is mixed using vacuum mass flow controllers and direct vacuum gauges. The resulting pressure of this mixture is kept constant at 0.3-1.0 Pa.
3. By means of a radio frequency power source a plasma is ignited over the surface of CeO2 ceramic target 3 (a short-term pressure increase may be required to ignite the discharge). The power density on the magnetron is held constant in range from tenths to units of $W \cdot cm^{-2}$. The distance between the target 3 and the membrane 1 is in the range from 0.5 to 3 times the radius of the target 3. Prior to the actual deposition, the target 3 is pre-sputtered for couple of minutes (off the membrane 1) in order to clean its surface.
4. After cleaning of the target 3, the deposition system is set into a sputtering configuration with the magnetron perpendicular to the membrane 1. Due to the simultaneous plasma etching of the membrane surface 1 and the CeOx deposition, a fiber-like structure with a large surface area is formed. The membrane 1 is etched in places where it is not being protected by sputtered CeOx layer which serves the role of masking element. By this mean a pronounced etched hollows are formed while the parts of the membrane which are being protected by CeOx thin film create the fibres. The deposition rate of CeOx thin film is in range of hundredths to units of $nm \cdot min^{-1}$.
5. If the deposition system is capable of sufficient manipulation with the substrate (i.e. rotating it by 180°) and if desired, the other side of the membrane 1 is also modified in the same manner as described in step 4.
6. Subsequently a thin catalyst layer is deposited onto the membrane 1 with modified surface. If the deposition apparatus is equipped with more magnetrons, this step can be carried out immediately; or after venting the chamber, changing the target 3 in the magnetron and re-pumping the vacuum chamber. Base pressure, the composition of the working atmosphere and the deposition parameters in this step must be selected as such that they provably lead to formation of catalytically active thin film.

Example 2 describes a laboratory-verified method of preparing the double-sided etched catalyst-coated membrane 1, type Nafion NE 1035 for use in a water electrolyzer. The manufacturing method of the membrane 1 proceeds in the following steps:
1. From a commercially available membrane 1, type Nafion NE 1035, a piece of a size compatible with the respective electrolyzer unit is cut. Membrane 1 is thoroughly cleaned by blowing with dry nitrogen. It is not recommended to clean it by wet techniques—chemically, since the membrane 1 should stay dry prior to insertion to the vacuum chamber. The membrane 1 is attached to the plate-shaped sample holder with the cut-out in the middle, thereby providing the possibility of deposition on both sides of the membrane 1.
2. The substrate holder with the membrane 1 is mounted on a rotary manipulator inside a vacuum deposition chamber, equipped with three magnetrons (targets 3 in magnetrons: CeO2, Ir, Pt). The oil-free scroll pump and turbomolecular pump evacuate the chamber down to the $5.10^{-5}$ Pa.
3. After reaching the aforementioned value of a base pressure, the vacuum mass flow controllers start to introduce Ar and O2, such that the ratio of flows is O2:Ar 1:65 and the absolute pressure of the mixture is constant at 0.4 Pa (in case of the tested apparatus, this corresponds to the O2 flow of 0.23 sccm, Ar flow of 15 sccm and partially lowered pumping speed of turbomolecular pump; however these values will be different at different setups). It is essential that gases of maximum purity (6.0) are introduced and that all the pipelines and hoses are sufficiently purged (including the vacuum part).

4. By means of a radio frequency power source a plasma is ignited over the surface of a four-inch CeO2 ceramic target 3 (a short-term pressure increase may be required to ignite the discharge, in case of tested apparatus to approx. 1 Pa). The power on the magnetron is held constant at 65 W, the target 3 to membrane 1 distance is 15 cm. Prior to the actual deposition, the target 3 is, in order to clean its surface, pre-sputtered for 5 minutes with its shutter still being closed (i.e. no material gets to the membrane 1). Next, the shutter is opened and the simultaneous deposition of material and etching of the membrane 1 begins; the target 3 is perpendicular to the membrane 1. It takes approx. 70 minutes to achieve desired structure, using the above mentioned deposition parameters.

5. After 70 minutes, the substrate holder with the membrane 1 is rotated by 180° and the other side of the membrane is treated the same way (provided the rotation of the sample holder is fast enough, there is no need to shut down the magnetron discharge).

6. Thin-film catalyst is consequently sputtered onto the modified membrane 1 with large surface. In case of water electrolyzer, Ir on the anode and Pt on the cathode side of PEM. Since both Ir and Pt are being deposited in pure Ar, it is necessary to again evacuate the chamber to 5.10-5 Pa and to create the 0.5 Pa working atmosphere using just Ar mass flow controller. In case of the tested apparatus, this corresponds to the Ar flow of 20 sccm and partially lowered pumping speed of turbomolecular pump.

7. By means of a direct current power source a plasma is ignited over the surface of a two-inch metallic Ir target 3 (a short-term pressure increase may be required to ignite the discharge, in case of tested apparatus to approx. 1 Pa). The power on the magnetron is held constant at 30 W, the target 3 to membrane 1 distance is 15 cm. Prior to the actual deposition, the target 3 is, in order to clean its surface, pre sputtered for 5 minutes with its shutter still being closed (i.e. no material gets to the membrane 1). Next, the substrate holder is rotated, so the target 3 is perpendicular to the anode side of membrane 1, the shutter is opened and the deposition of material to the membrane 1 begins. Using the above mentioned deposition parameters, it takes approx. 30 min to deposit 50 nm of Ir.

8. By means of a direct current power source a plasma is ignited over the surface of a two-inch metallic Pt target 3 (a short-term pressure increase may be required to ignite the discharge, in case of tested apparatus to approx. 1 Pa). The power on the magnetron is held constant at 20 W, the target 3 to membrane 1 distance is 15 cm. Prior to the actual deposition, the target 3 is, in order to clean its surface, pre sputtered for 5 minutes with its shutter still being closed (i.e. no material gets to the membrane 1). Next, the substrate holder is rotated, so the target 3 is perpendicular to the cathode side of membrane 1, the shutter is opened and the deposition of material to the membrane 1 begins. Using the above mentioned deposition parameters, it takes approx. 35 min to deposit 50 nm of Pt.

9. After completion of all four depositions, two for modification of surface of the membrane 1 and two for catalyst deposition (Ir on the anode side of membrane 1, Pt on the cathode side of membrane 1), the chamber is vented back to atmospheric pressure and the modified catalyst-coated membrane 1 is ready for its use in water electrolyzer. It is inserted in between the cathode gas diffusion layer (in this case Sigracet 29BC) and the anode liquid-gas diffusion layer (in this case sintered micro grained Ti plate).

INDUSTRIAL APPLICABILITY

The membrane produced by a method combining reactive magnetron thin-film sputtering and plasma etching is industrially applicable in particular for use in a proton exchange membrane water electrolyzers. Water electrolyzer is a device that uses electrical current of certain voltage to electrochemically split water into hydrogen and oxygen. As such, it is a key building block of so-called hydrogen economy. Stored hydrogen can be subsequently converted to electricity by means of hydrogen fuel cells. This cycle is relevant with respect to stabilization of modern electrical grids powered by electricity form intermittent renewable sources such as wind and solar. The membrane is also industrially applicable in hydrogen or methanol fuel cells.

The invention claimed is:

1. A method of manufacturing a proton exchange membrane with a surface fiber structure, the method comprising:
    inserting the membrane into a vacuum chamber having a magnetron sputtering system with a cerium oxide target, the sputtering system having an atmosphere of inert gas and $O_2$ as a reactive gas;
    igniting plasma as an ionized atmosphere to provide simultaneous plasma etching of a surface of the membrane and deposition of cerium oxide with a layer thickness in a range of tenths to tens of nanometers on the etched surface of the membrane resulting in formation of fibers; and
    magnetron sputtering a layer of catalyst onto the surface of the membrane, wherein the catalyst comprises iridium.

2. The method of claim 1, wherein a cerium oxide film with thickness equal or lower than 10 nm is deposited on the etched surface of the membrane at a deposition rate ranging within a range of 0.01 to 1 nanometer per minute.

3. The method of claim 1, wherein the layer of catalyst includes a loading lower than 1 mg cm$^{-2}$.

4. The method of claim 1, wherein a single-or multi-elemental noble metal-based catalyst is deposited on the surface of the membrane.

5. The method of claim 1, wherein the membrane is made of polymer and on at least one of its sides features a porous surface made of fibers, the porous surface having cross-sectional dimensions lower than their length and the porous surface being an integral and inseparable part of the membrane.

6. The method of claim 5, wherein the polymer includes an ionomer material.

7. The method of claim 1, wherein the atmosphere for plasma etching is at a pressure between 0.3 Pa and 1.0 Pa and comprises argon as inert gas and $O_2$ in a ratio between 1:400 and 1:40;

wherein a deposition rate of cerium oxide for plasma etching ranges from 0.01 to 1 nanometer per minute; and wherein a spacing between the fibers is equal or lower than an average length of the fibers.

8. The method of claim 1, wherein the membrane is configured for use in a water electrolyzer.

9. The method of claim 1, wherein the membrane is configured for use in a fuel cell.

* * * * *